(12) United States Patent
Rivera

(10) Patent No.: US 6,536,719 B2
(45) Date of Patent: Mar. 25, 2003

(54) SINGLE-HANDED CORD/CABLE MANAGEMENT DEVICE

(75) Inventor: Alexander F. Rivera, Brick, NJ (US)

(73) Assignee: .Engineering, Inc., Brick, NJ (US)

( * ) Notice: Subject to any disclaimer, the term of this patent is extended or adjusted under 35 U.S.C. 154(b) by 0 days.

(21) Appl. No.: 09/907,016

(22) Filed: Jul. 17, 2001

(65) Prior Publication Data

US 2003/0015628 A1 Jan. 23, 2003

(51) Int. Cl.$^7$ ............................ F16L 3/12; B42F 1/02; B65D 63/00
(52) U.S. Cl. ................. 248/74.3; 248/68.1; 24/16 PB; 24/545
(58) Field of Search .................. 248/74.3, 74.1, 248/68.1; 24/16 PB, 545, 557

(56) References Cited

U.S. PATENT DOCUMENTS

| | | | |
|---|---|---|---|
| 2,537,519 A | | 1/1951 | Eastman |
| 3,571,861 A | * | 3/1971 | Olson ...................... 24/30.5 R |
| 4,182,005 A | | 1/1980 | Harrington |
| 4,637,097 A | | 1/1987 | Secord |
| 4,674,720 A | * | 6/1987 | Fetsch ........................ 248/74.1 |
| 4,688,739 A | | 8/1987 | Moore |
| 4,881,301 A | | 11/1989 | Sweeney et al. |
| 4,958,791 A | | 9/1990 | Nakamura |
| 5,075,933 A | | 12/1991 | Kemper |
| 5,079,802 A | | 1/1992 | Blase et al. |
| 5,230,489 A | | 7/1993 | White et al. |
| 5,414,911 A | * | 5/1995 | Adams ......................... 24/545 |
| 5,423,501 A | * | 6/1995 | Yu ................................. 248/61 |
| 5,494,245 A | | 2/1996 | Suzuki et al. |
| 5,533,696 A | * | 7/1996 | Laughlin et al. ........... 248/74.2 |
| 5,625,931 A | * | 5/1997 | Visser et al. ................... 24/557 |
| 5,729,872 A | | 3/1998 | Ginocchio |
| 5,732,445 A | | 3/1998 | Stodolka et al. |
| 5,806,819 A | | 9/1998 | Martone |
| 5,937,488 A | | 8/1999 | Geiger |
| 6,101,684 A | | 8/2000 | Ginocchio |

* cited by examiner

*Primary Examiner*—Anita King
(74) *Attorney, Agent, or Firm*—Reed Smith LLP

(57) ABSTRACT

The present invention is directed to a device for bundling cables, ropes, wires, or other long flexible materials that are desired to be bundled. The device comprises an arcuate strap for encircling bundled cables. The strap is preferably discontinuous, with first and second ends forming a mouth into a central cavity formed by an arcuate strap. Finger grips are located adjacent to the first and second ends, allowing fingers of a user to be used to pull the first and second ends of the strap to open the normally closed mouth of the device. The device also preferably includes engagement features on the first and second ends to allow the first and second ends to be forced into engagement to lock cables into the cavity formed by the arcuate shape of the strap.

3 Claims, 8 Drawing Sheets

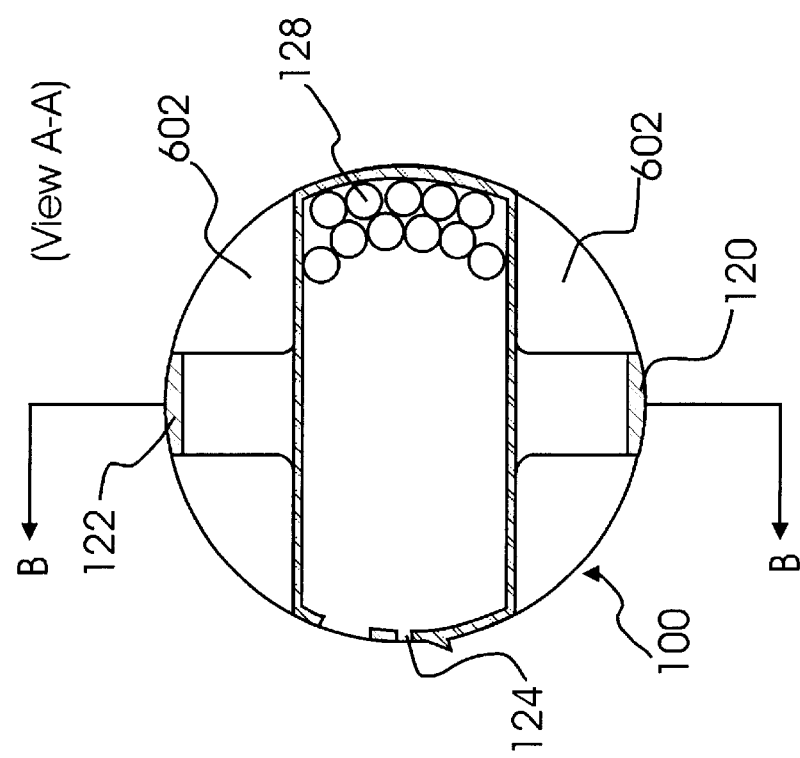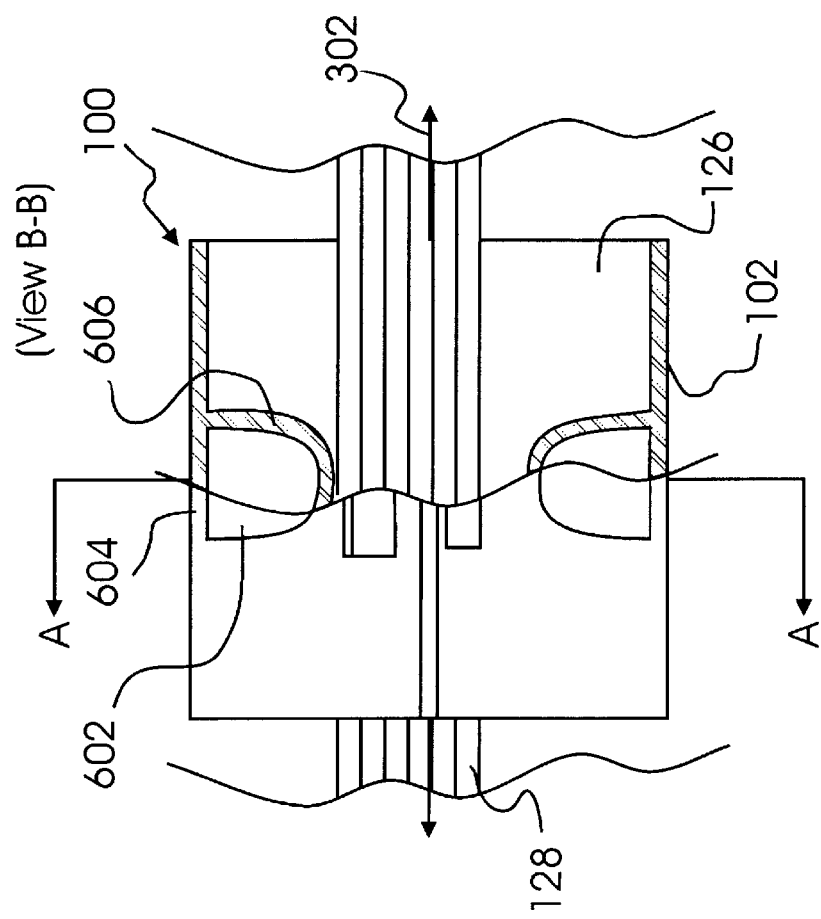

SINGLE-HANDED CORD/CABLE MANAGEMENT DEVICE

FIELD OF THE INVENTION

The present invention pertains generally to the organization and storage of flexible tubes and cables, and more particularly to devices for releasably constraining flexible tubes and cable together in a manner amenable to quick and repeatable bundling.

BACKGROUND OF THE INVENTION

The need to coil or bundle wires, cables, flexible tubes, ropes and hoses exists throughout industry and home life. Devices such as extension cords, cables, air hoses, ropes, and other long, flexible articles (hereinafter referred to generically as "cables") present a storage problem, where coiled cables often become tangled due to the lack of constraints to keep the cables properly coiled. The traditional storage method is to wrap cables around a person's elbow and between the thumb and forefinger. Once the cable has been coiled, some form of strap is placed around the coil and fastened to prevent the coil from tangling or uncoiling.

An early device devised to act as a strap consisted of a simple piece of bendable wire which could be twisted to retain the wire around the bundled cables. Twist ties, as these wire retainers are frequently called, provide an economical tie, but can not be easily attached single-handedly, and furthermore have limited lifespans due to fatiguing of the wire. Furthermore, untwisting the tie can often be difficult.

Plastic variations of the twist tie have been developed which rely on toothed engagement fasteners to prevent the tie from coming lose. One variation of a plastic tie uses a serrated end which is passed through a slot in the opposite end of the tie as a means of adjustably fastening the tie. Although this construction is economical, it likewise does not lend itself to single-handed installation. Furthermore, once fastened, the serrated edges can be difficult to withdraw from the slot, making it difficult to remove the tie, and thus release bundled cables.

Later developments, such as the tying means shown in U.S. Pat. No. 4,958,791 to Nakamura, incorporate one or more teeth on the end or ends of the strap to lock the strap in the closed position. These straps also utilize a normally open position to ease the difficulties of placing cables into the cavity of the device, allowing easier single handed operation. Once the device has been wrapped around the object or objects to be constrained, the ends of the strap are forced into engagement, locking the tie into place. Nakamura provides a pair of tabs to release the engagement teeth, allowing the band once fastened to be unlocked. Once unlocked, however, the mouth of the band is open, allowing bundled cables or wires to fall from the device. Furthermore, grouping the cables one at a time into the Nakamura device is difficult, since there is no method provided for holding the device while individual cables are placed into the device.

It is therefore an object of the present invention to provide a cable management device which is easily held to allow cables to be placed into the device one at a time, while reducing the likelihood of cables already placed into the device from falling out of the device. It is also an object of the present invention to provide a cable management device having a controllable mouth gap to ease the difficulties of placing cables or wires into the device. Finally, it is also an object of the present invention to provide a cable management device that can be readily released and reused.

SUMMARY OF THE INVENTION

The present invention is directed to a cable bundling device. The cable bundling device has a flexible strap portion for surrounding the bights of a bundled group of cables, wires, or other long flexible articles (hereafter referred to generically as "cables"). The strap forms a circular shape to surround the bights. The circular shape forms a central cavity within which the cables may be restrained. The strap has three states. The strap has a first and a second end which form a discontinuity in the perimeter of the strap. Finger grips are mounted adjacent to the ends of the strap, allowing the fingers of a user to be inserted into the finger grips to pull the ends apart, thereby opening a mouth into the cavity of the cable bundling device. The strap has a relaxed state wherein the first and second ends are close together, such that the mouth of the device must be opened through use of the finger grips before cables can be placed into or removed from the cable bundling device. The strap also has an open state wherein the ends of the strap have been pulled apart to form the mouth.

In a further embodiment, the cable bundling device has engagement features located on the ends of the strap, allowing the strap ends to be locked together. The engagement features may be a tooth extending from a first end of the strap, and a slot extending from the second end. Placement of the tooth into the slot limits the ability of the two ends to be separated, thereby locking cables into the cavity of the cable bundling device. Placement of the tooth into the slot may be accomplished by forcing the ends of the strap to overlap, allowing the tooth and slot to enter into an interlocked state.

In a still further embodiment, engagement features may include a plurality of teeth on one end, with at least one tooth on the opposite end, such that the position of the two strap ends can be varied in the locked state allowing the cable bundling device to be tightened around a group of bundled cables.

Other features and advantages of the invention will be apparent from the following description of the preferred embodiment, and from the claims.

BRIEF DESCRIPTION OF THE DRAWINGS

FIG. 1A is a detail view of the mouth area of FIG. 1.

FIG. 6 shows a view in partial cross-section along plane B—B as shown in FIG. 7 of a cable bundling device as viewed along an axis perpendicular to the long axis of the device, wherein the finger grips comprise channels and backstraps.

FIG. 7 shows a view in partial cross-section along plane A—A as shown in FIG. 6 of a cable bundling device as viewed along the long axis of the device, wherein the finger grips comprise channels and backstraps.

DETAILED DESCRIPTION OF THE INVENTION

Figure 1:
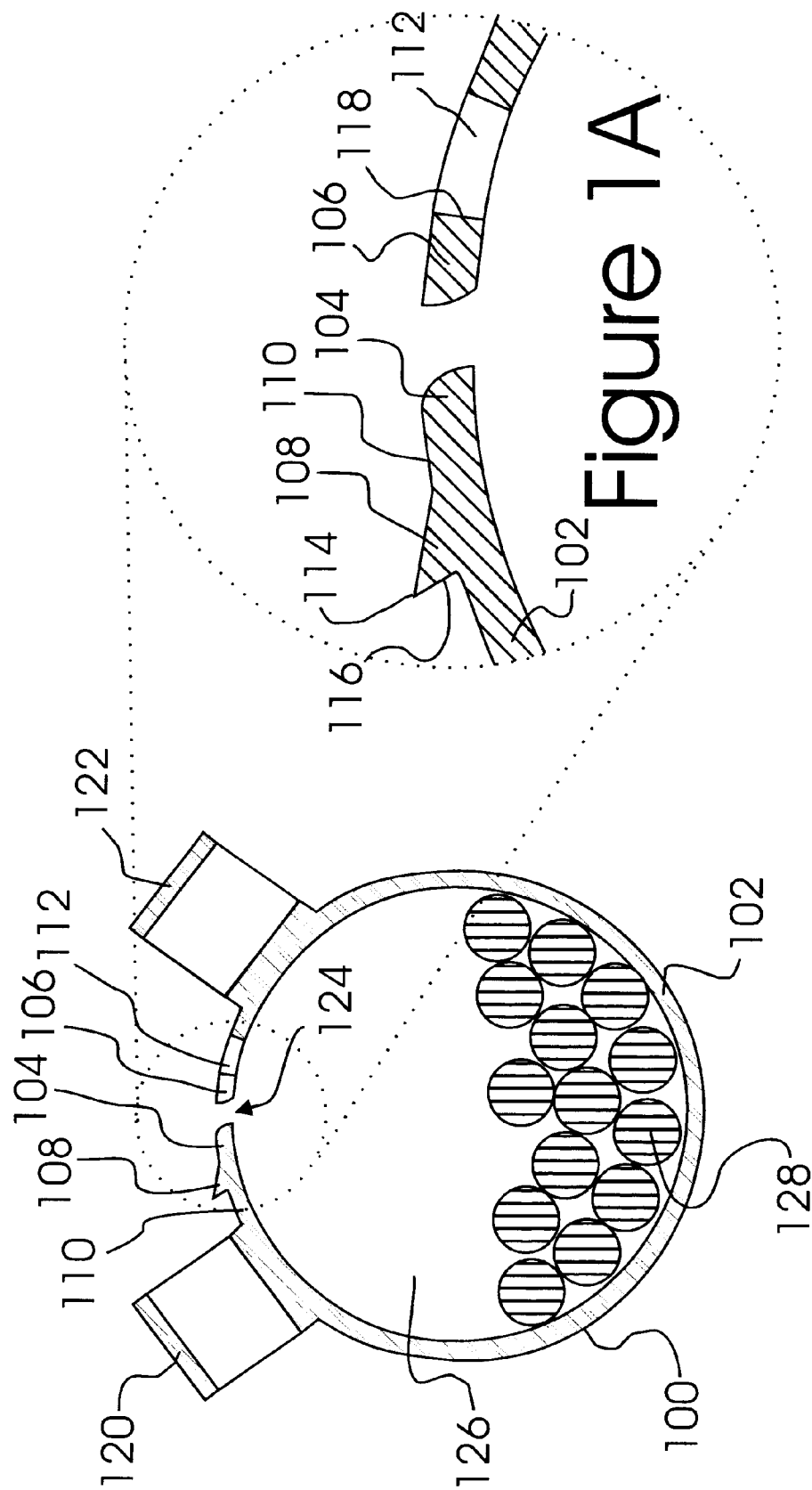
FIG. 1 shows a cross-sectional view of a cable bundling device according to the present invention as viewed along the long axis of the device, where the cable bundling device is shown in a relaxed state.
Figure 5:
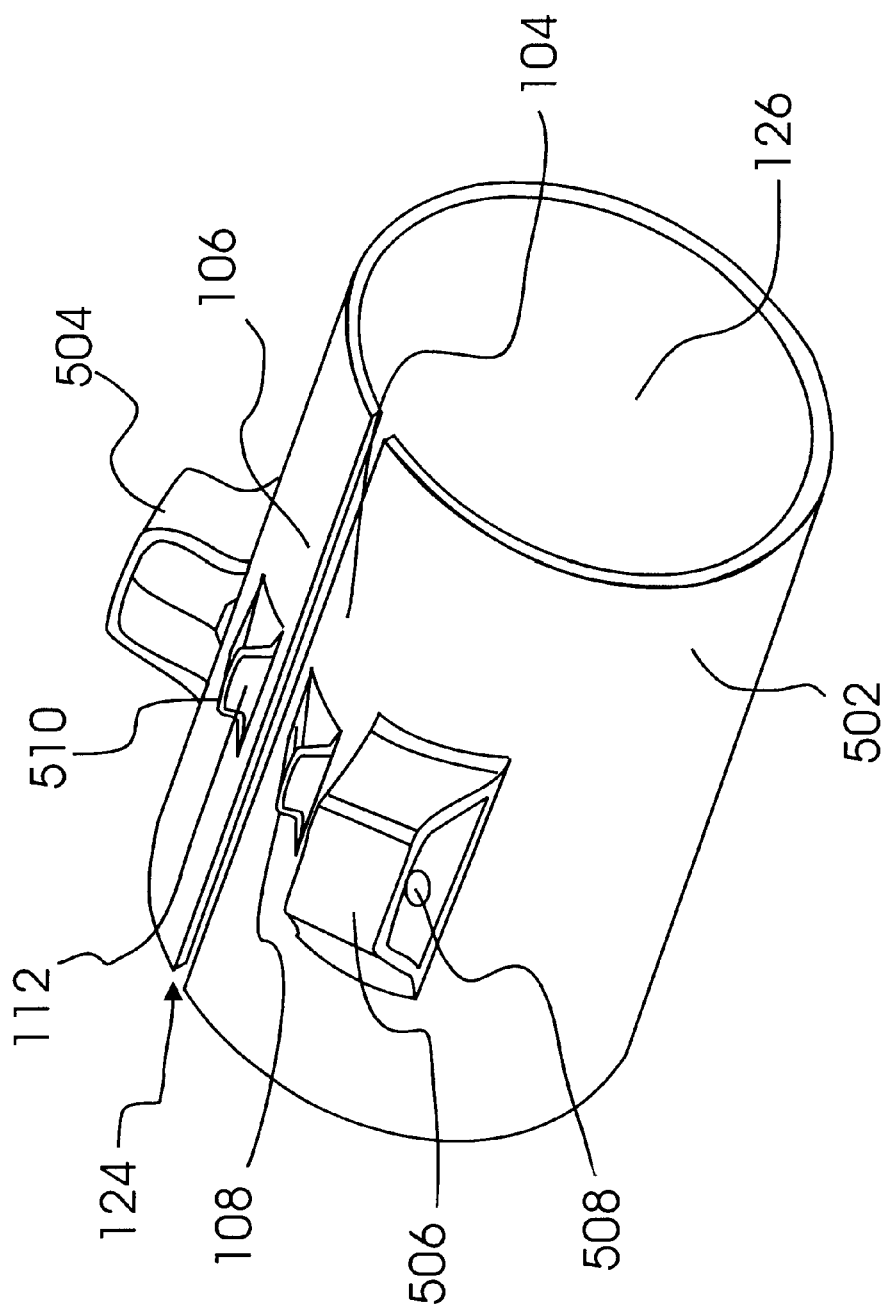
FIG. 5 shows in perspective a cable bundling device according to the present invention, wherein the device is formed from a metallic strap.

In the Figures, wherein like numerals indicate like elements, there is shown a presently preferred embodiment of a cable bundling device according to the present invention. As shown in FIG. 1, the device 100 includes a flexible arcuate strap 102. The strap 102 is preferably made from a material having an elastic tendency to return to a relaxed state. Such materials include various plastics, such as nylon and teflon. Alternately, the strap may be formed from a metallic material such as spring steel, as shown in FIG. 5, and discussed further below.

The device 100 of the present invention has three states. The normal state is associated with a relaxed state of the device 100, in which the first 104 and second 106 ends substantially abut, preventing cables 128 bundled in the device 100 from freely falling from the cavity 126 of the device 100. The second state of the device is when the first 104 and second 106 ends have been forced apart to open the mouth 124 of the device 100. The third state is a locked state discussed further below.

The strap of the present invention may be made from any flexible material, as long as the material has sufficient strength and resiliency to accomplish the present invention. Flexible plastics, metal, rubber, are preferred due to the ease with which the cable bundling device can be formed from these materials. The finger loops which are provided to allow the two ends to be separated may be integrally formed with the strap, or may be formed separately and attached to the strap, such as through bonding, welding, or mechanical fastening.

The strap has a first 104 and a second 106 end. In the relaxed state, the ends 104 and 106 of the strap substantially complete the circumference of the arcuate shape of the strap. The first end 104 of the strap has a male engagement structure such as a raised tooth 108 (shown in FIG. 1A which is a detail view of the mouth area of FIG. 1) extending above the outer surface 110 of the strap. The tooth 108 is at its highest at its point 114 opposite the first end 104 of the strap, and tapers to join the outer surface 110 of the strap 102 adjacent the first end 104 of the strap. The second end 106 of the strap 102 has a slot 112 through the material of the strap 102. The slot 112 has a front edge 118 which is parallel to a long axis of the device (shown in FIG. 3 as 302), such that when the tooth 108 is placed in the slot 112, the face 116 of the tooth rests against the front edge 118 of the slot 112.

First 120 and second 122 finger grips are located adjacent to the first 104 and second 106 ends of the strap 102. The finger grips 120, 122 are preferably closed rings or loops through or into which a finger can be inserted. Other shapes, such as a finger hook or a thimble or loops or cup-shaped shell not necessarily closed, can be used, however such shapes may present a tendency to snag on other objects.

The relaxed state of the device 100 results in the mouth 124 of the device (forming the entrance into the cavity 126 of the device) being substantially closed. The first 104 and second 106 ends of the strap 102 may be allowed to overlap, as the desired result is to restrain cables 128 from freely leaving the cavity 126 unless the device 100 is forced into an open state.

Figure 2:
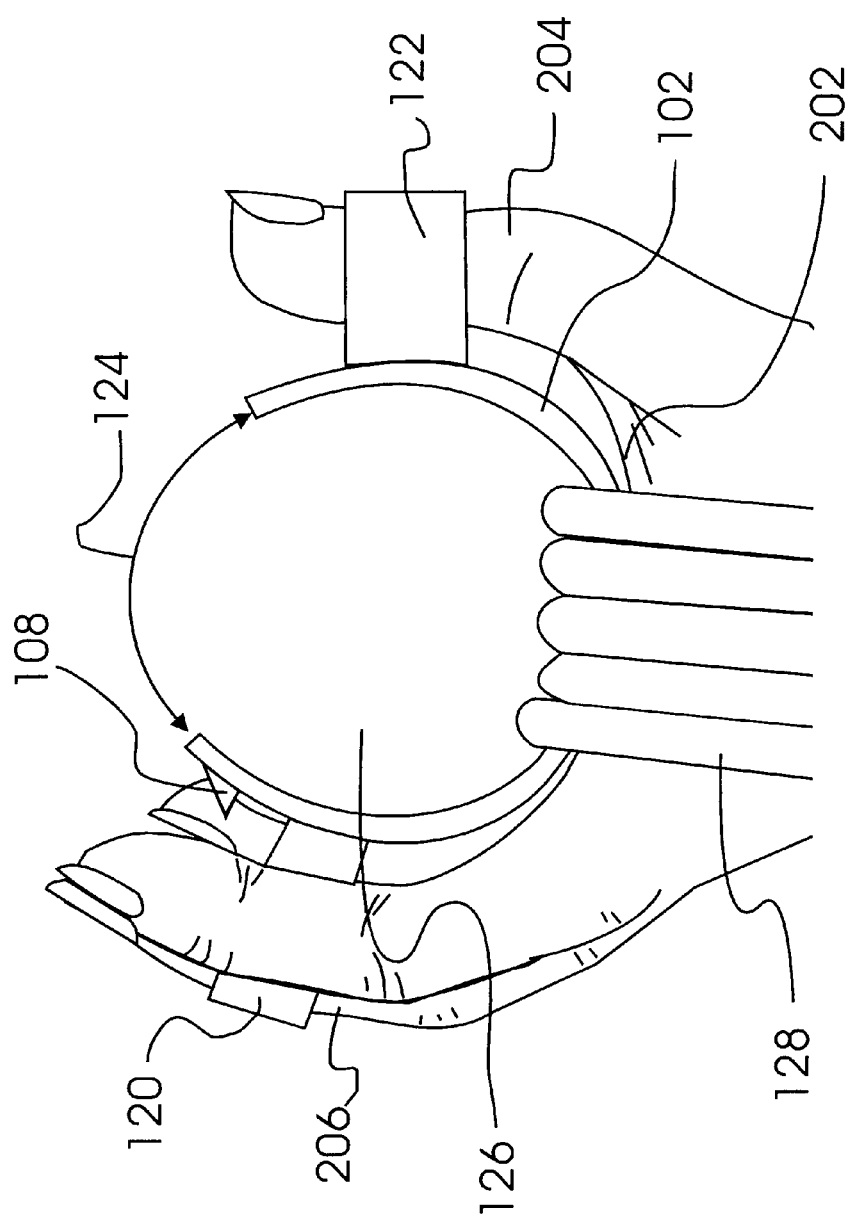
FIG. 2 shows a cable bundling device according present invention in an opened state.

As shown in FIG. 2, the circumference of the arcuate strap 102 is preferably chosen so that the strap 102 comfortably rests in the palm 202 of a user's hand between the thumb 204 and middle fingers 206. The finger grips 120, 122 are disposed such that the middle finger 206 and the thumb 204 can be inserted into the first 120 and second 122 finger grips. The circumference of the arcuate strap 102 may varied to accommodate differing sizes and amounts of cables to be bundled. Variance of the circumference of the arcuate strap 102 may be coordinated with re-positioning of the finger grips 120, 122 to maintain correct ergonomic positioning. Although the preferred embodiment allows the arcuate strap 102 to rest in the palm 202 of a user's hand, the only size limitation is the ability of a user to single-handedly operate the finger grips 120, 122 to open the device 100.

Figure 3:
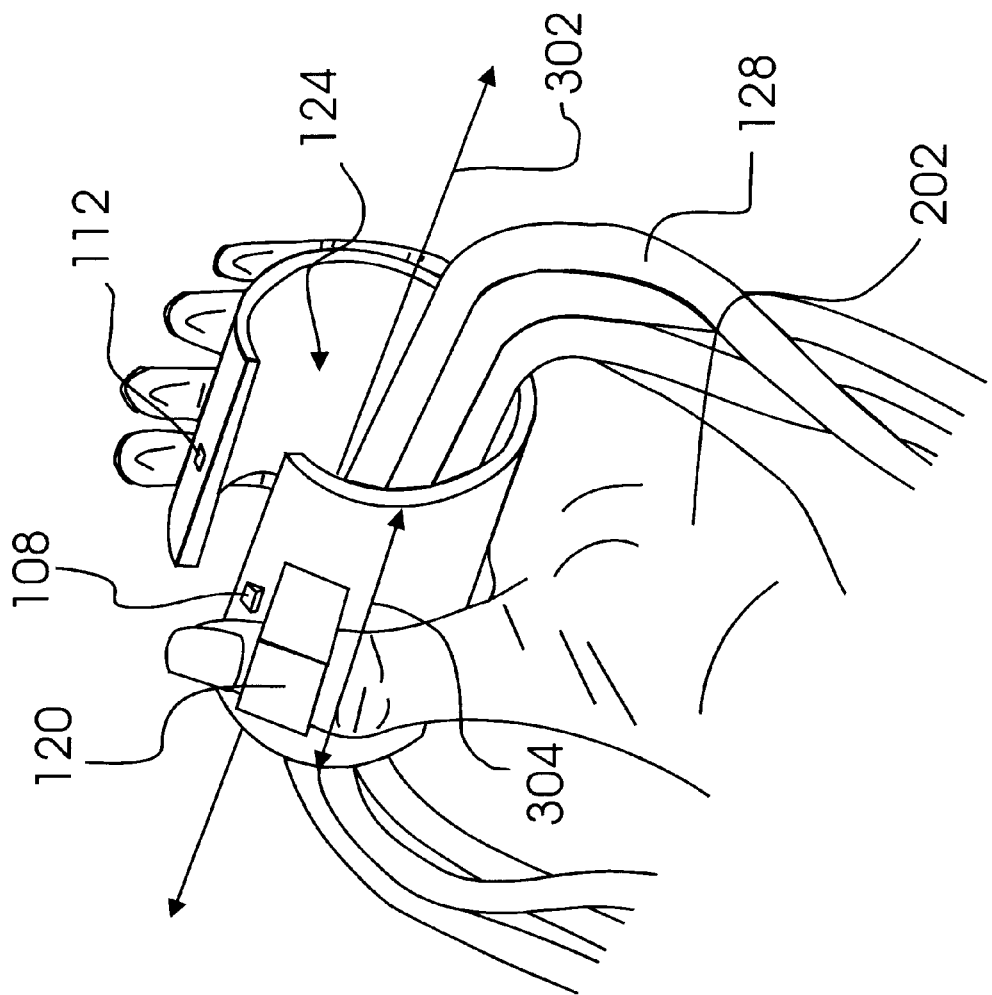
FIG. 3 shows a perspective view of a cable bundling device according to the present invention, with the cable bundling device nested in the palm of a user's hand.

As shown in FIG. 3, the length 304 of device 100 may be sufficiently long to provide a protective layer in the palm 202 of a hand when cables 128 are being placed into the device 100. The protection provided both helps in keeping a user's hand clean, since the cables do not contact the hand holding the device 100, but also provide a protective layer to prevent friction from causing injury to the hand. Also, the protection provided insulates a user from rough or frayed surfaces associated with a cable.

The orientation of the device 100 in the palm 202 of a user's hand furthermore allows the elbow (not shown) of a user to be used to maintain loop length while cable 128 is being wound into the device 100. With the device 100 in the palm 202 of the hand, the mouth 124 can be opened each time a bight is passed into the device 100, or held continuously open while cable 128 is bundled.

Figure 4:
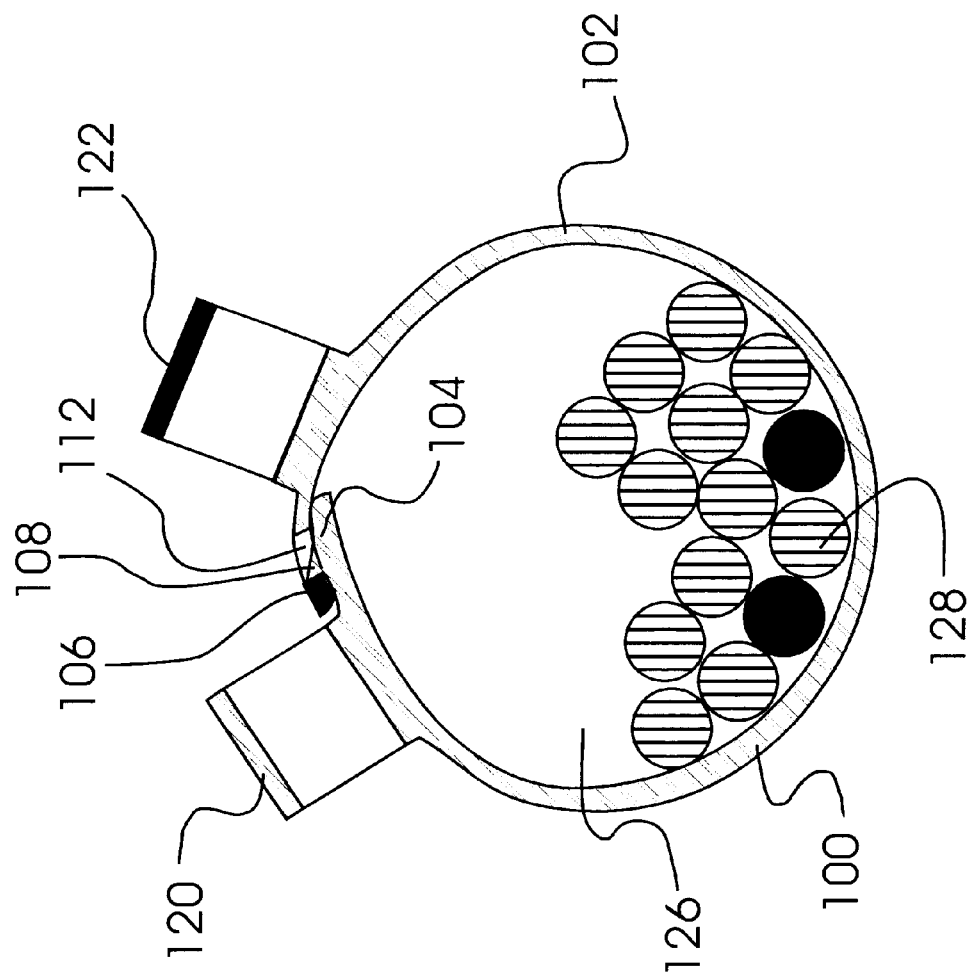
FIG. 4 shows a cable bundling device according to the present invention in cross-section as viewed along the long axis of the device, where the cable bundling device is shown in locked state.

As shown in FIG. 4, the device 100 may be placed into a locked closed state by forcing the first end 104 of the arcuate strap 102 into a position under the second end 106, such that the engagement tooth 108 extends through the slot 112 in the second end 106. The strap 102 is preferably formed such that the first end 104 of the strap 102 is biased against the second end 106 when the tooth 108 is inserted into the slot 112. In order to release the locked engagement, the finger grip 120 on the first end 104 may be pushed inward, disengaging the tooth 108 from the slot 112 and allowing the mouth 124 of the device 100 to be opened.

Although the device is preferably fabricated from a plastic, the device may be fabricated from other materials. Shown in FIG. 5, the device 100 may be fabricated from a spring metal strap 502. The finger grips 504, 506 may be attached to the spring metal strap 502, such as by bonding or mechanical fastening. The finger grips 504, 506 are shown in FIG. 5 as being riveted 508 to the strap 502. The engagement tooth 108 may also be formed from a separate piece and bonded or mechanically fastened to the strap 502, or may alternately be formed by punching a raised tooth or displaced portion into the strap 502 itself. The slot 112 when used with a metallic strap may also be formed by punching a rectangular hole or displaced portion through the strap 502, or may alternately be formed by punching a tooth shape into the second end 106, such that when the tooth 108 of the first end 104 is aligned with the tooth 510 of the second end 106, the pocket formed by the tooth 510 of the second end allows the tooth 108 of the first end to nest into and engage the tooth 510 of the second end. In order to accomplish such nesting, the second tooth 510 must be sized such that the first tooth 108 will nest inside the second tooth 510.

As shown in FIGS. 6 and 7, the finger grips 120, 122 do not need to be external to the strap 102, but may rather be integrally formed into the strap 102 itself. FIG. 6, shown in partial cross-section, shows a cable bundling device 100 according to the present invention wherein channels 602 have been molded into the sides of the device 100 to allow fingers to pass between backstraps 604 and the body 606 of the device 100. As shown in FIG. 7, the channels 602 result in a constriction in the cavity 126 when viewed along the long axis of the device 100.

Figure 8:
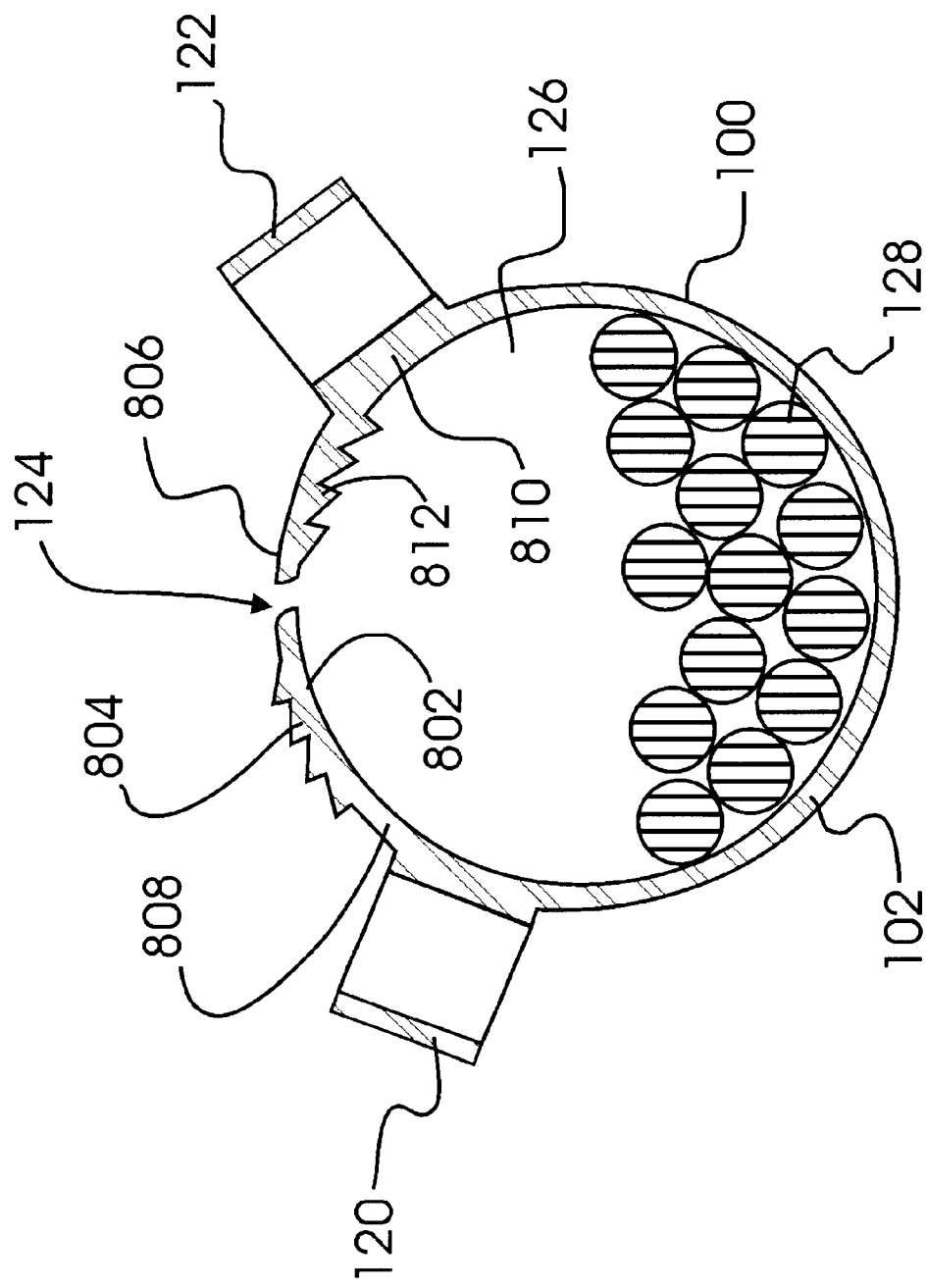
FIG. 8 shows a cross-sectional view of a cable bundling device according to the present invention as viewed along the long axis of the device, where the cable bundling device utilizes multiple teeth engagement means on both ends to provide a variable locked position.
Figure 9:
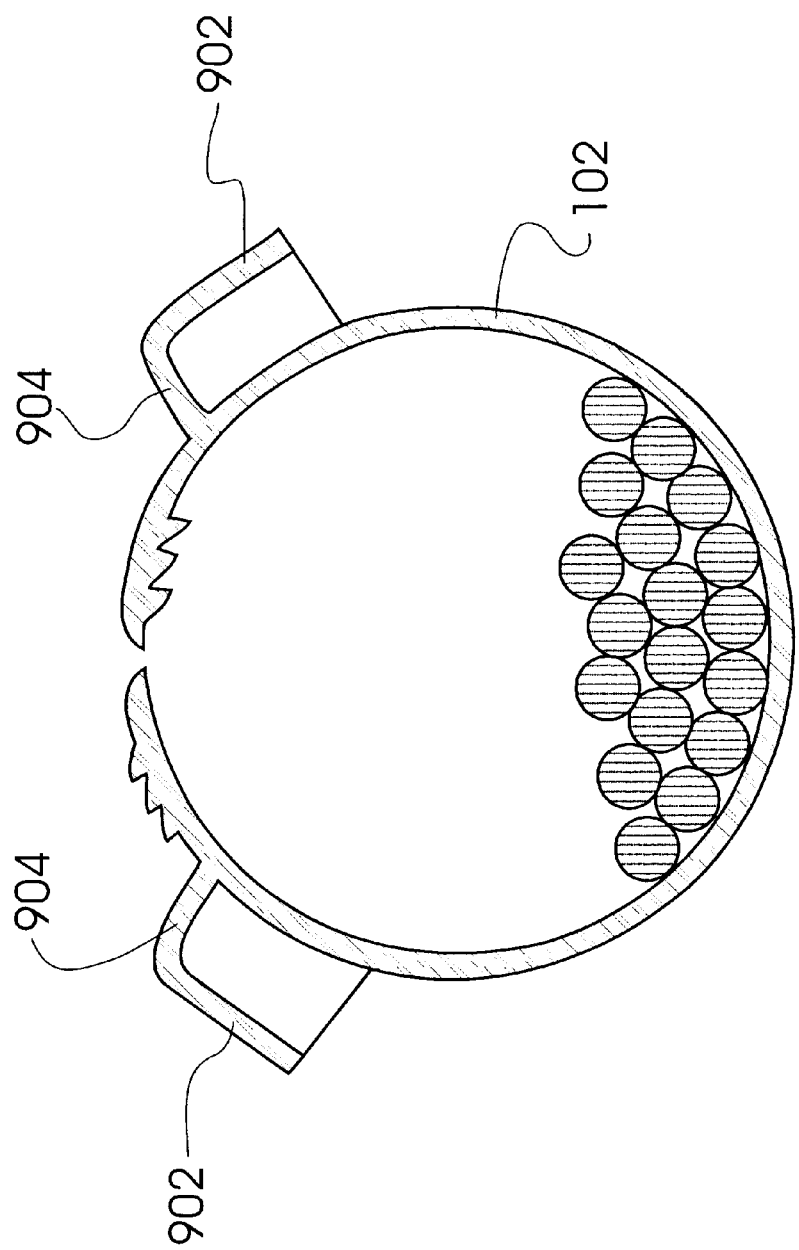
FIG. 9 shows a cross-sectional view of a cable bundling device according to the present invention as viewed along the long axis of the device, wherein the cable bundling device utilizes cup shaped finger grips.

Although the presently preferred embodiment relies on a single toothed engagement system for simplicity, multiple tooth engagement systems may be used in conjunction with the cable bundling device 100 of the present invention. Shown in FIG. 8 is a multi-tooth engagement system used in conjunction with the present invention. A first end 802 of the strap 102 has multiple teeth 804, each tooth 804 having a consistent size. The teeth 804 face the exterior 808 of the arcuate strap 102 in its relaxed state. The second end 806 of the strap 102 has an inner surface 810 on which multiple teeth 812 are formed, with the size of the teeth 812 consistent with the size of the teeth 804 on the first 20 end 802. The teeth 804, 812 on the first 802 and second 806 ends are preferably back-cut, such that tension in the strap 102 when engaged causes engaged teeth 804, 812 to pull together.

The teeth 804, 812 when engaged can be released simply by pressing inward on the first end 802 of the device. With the device 102 cradled in the palm 202 of a hand, the device 100 can be opened to allow cables 128 to be passed through the mouth 124 into the cavity 126, relaxed to restrain the cables 128 within the cavity 126, and closed to a locked engagement state without having to change the position of the device 100 within a user's palm 202.

In addition to utilizing open ended finger grips, the cable bundling device may utilize finger grips 902 having closed ends 904, such that the finger grips form a cup shape to enclose an inserted finger.

Should the user desire to release the cables 124, the user can again place the bundling device 100 into the palm 202 of his or her hand, with a thumb 204 and an opposing digit such as the middle finger 206 inserted into the finger grips 120, 122. As the engagement means of the bundling device 100 have an overlying and an underlying feature, the locked state of the bundling device 100 can be released by extending the digit in the finger grip 122 adjacent to the over-riding engagement feature, and extending the finger. Alternately, the engagement feature may be released by clenching the digit in the finger grip 120 adjacent to the underlying engagement feature, or by a combination of extending one digit and clenching the other to cause the engagement features to disengage from each other.

The description of the embodiments herein are provided to enable any person skilled in the art to make and use the present invention. Various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

What is claimed is:

1. A cable bundling device comprising:
   a flexible arcuate strap portion, said flexible arcuate strap portion having a first end and a second end, and an inner surface and an outer surface, said outer surface forming a perimeter of said flexible arcuate strap portion, wherein said first and second ends form a discontinuity in said perimeter of said flexible arcuate strap portion, and wherein said inner surface forms a cavity;
   first and second finger grips, said first finger grip being located adjacent to said first end, and said second finger grip being located adjacent to said second end, wherein said first and second finger grips allow interposition of a finger between said flexible arcuate strap portion and said finger grip, wherein said first and second ends substantially abut each other when said flexible arcuate strap portion is in a relaxed state; and
   a male engagement feature located adjacent to said first end, and a female engagement feature located adjacent to said second end, wherein said male and female engagement features interlock when said flexible arcuate strap portion is forced into a closed state;
   wherein said finger grips are formed separately from said flexible arcuate strap portion, and are mechanically fastened to said flexible arcuate strap portion.

2. A cable bundling device comprising:
   a flexible arcuate strap portion, said flexible arcuate strap portion having a first end and a second end, and an inner surface and an outer surface, said outer surface forming a perimeter of said flexible arcuate strap portion, wherein said first and second ends form a discontinuity in said perimeter of said flexible arcuate strap portion, and wherein said inner surface forms a cavity;
   first and second finger grips, said first finger grip being located adjacent to said first end, and said second finger grip being located adjacent to said second end, wherein said first and second finger grips allow interposition of a finger between said flexible arcuate strap portion and said finger grip, wherein said first and second ends substantially abut each other when said flexible arcuate strap portion is in a relaxed state;
   wherein at least one finger grip comprises a cup-shaped shell, said cup shaped shell oriented to allow insertion of a digit associated with a hand of a user when said device is cradled in the hand of a user.

3. A cable bundling device comprising:
   a flexible arcuate strap portion, said flexible arcuate strap portion having a first end and a second end, and an inner surface and an outer surface, said outer surface forming a perimeter of said flexible arcuate strap portion, wherein said first and second ends form a discontinuity in said perimeter of said flexible arcuate strap portion, and wherein said inner surface forms a cavity;
   a first finger grip and a second finger grip, said first finger grip being located adjacent to said first end, and said second finger grip being located adjacent to said second end, wherein said first finger grip and said second finger grip allow interposition of a finger between said flexible arcuate strap portion and said finger grip, wherein said first and second ends substantially abut each other when said flexible arcuate strap portion is in a relaxed state;
   wherein at least one finger grip comprises a channel formed in said flexible arcuate strap portion, said channel comprising a depression in said flexible arcuate strap portion, said channel further comprising a back strap, said back strap positioned to constrain movement of a digit in said channel.

* * * * *